United States Patent
Karim et al.

(10) Patent No.: US 9,698,193 B1
(45) Date of Patent: Jul. 4, 2017

(54) MULTI-SENSOR PIXEL ARCHITECTURE FOR USE IN A DIGITAL IMAGING SYSTEM

(71) Applicant: KA Imaging Inc., Waterloo (CA)

(72) Inventors: Karim S. Karim, Waterloo (CA); Sina Ghanbarzadeh, Kitchener (CA)

(73) Assignee: KA IMAGING INC., Waterloo, Ontario (CA)

( * ) Notice: Subject to any disclaimer, the term of this patent is extended or adjusted under 35 U.S.C. 154(b) by 0 days.

(21) Appl. No.: 15/266,051

(22) Filed: Sep. 15, 2016

(51) Int. Cl.
| | |
|---|---|
| H01L 27/14 | (2006.01) |
| H01L 27/146 | (2006.01) |
| H01L 31/0224 | (2006.01) |
| H01L 31/0216 | (2014.01) |
| G01T 1/20 | (2006.01) |
| G01T 1/24 | (2006.01) |

(52) U.S. Cl.
CPC ...... *H01L 27/14663* (2013.01); *G01T 1/2018* (2013.01); *G01T 1/241* (2013.01); *G01T 1/247* (2013.01); *H01L 27/14636* (2013.01); *H01L 27/14638* (2013.01); *H01L 31/02161* (2013.01); *H01L 31/022408* (2013.01)

(58) Field of Classification Search
None
See application file for complete search history.

(56) References Cited

U.S. PATENT DOCUMENTS

| | | | |
|---|---|---|---|
| 4,233,514 A | 11/1980 | Kingsley | |
| 5,880,472 A | 3/1999 | Polischuk et al. | |
| 6,373,062 B1 * | 4/2002 | Ghelmansarai | G01T 1/2928 250/370.01 |
| 6,806,473 B2 | 10/2004 | Honda et al. | |
| 7,256,402 B1 | 8/2007 | Lee | |
| 7,615,731 B2 | 11/2009 | Heiler et al. | |
| 7,671,342 B2 * | 3/2010 | Bani-Hashemi | G01T 1/2008 250/370.09 |
| 9,269,838 B2 | 2/2016 | Karim et al. | |
| 2004/0178426 A1 | 9/2004 | Melekhov et al. | |
| 2007/0108398 A1 | 5/2007 | Imai | |
| 2009/0026381 A1 | 1/2009 | Iwazaki | |
| 2009/0026382 A1 | 1/2009 | Sakamoto et al. | |
| 2009/0246402 A1 | 10/2009 | Mataki et al. | |

(Continued)

FOREIGN PATENT DOCUMENTS

| | | |
|---|---|---|
| JP | 2006156555 | 6/2006 |
| WO | 02067337 | 8/2002 |
| WO | 2010121386 | 10/2010 |

OTHER PUBLICATIONS

Canadian Intellectual Property Office As International Searching Authority, International Search Report and Written Opinion for PCT Patent App. No. CA2016/050830, Oct. 6, 2016.

(Continued)

*Primary Examiner* — Shaun Campbell
(74) *Attorney, Agent, or Firm* — Gowling WLG (Canada) LLP; Jeffrey W. Wong

(57) ABSTRACT

A system and method for a multi-sensor pixel architecture for use in a digital imaging system is described. The system includes at least one semiconducting layer for absorbing radiation incident on opposites of the at least one semiconducting layer along with a set of electrodes on one side of the semiconducting layer for transmitting a signal associated with the radiation absorbed by the semiconducting layer.

10 Claims, 16 Drawing Sheets

(56) References Cited

U.S. PATENT DOCUMENTS

2014/0346631 A1\* 11/2014 Karim ................ H01L 31/085
                                                                257/435
2015/0001539 A1   1/2015 Smith et al.

OTHER PUBLICATIONS

Ghanbarzadeh et al., "Low Dark Current Amorphous Silicon Metal-Semiconducting-Metal Photodetector for Digital Imaging Applications", IEEE Electron Device Letters, Feb. 2014, pp. 235-237, vol. 35, No. 2.
Canadian Intellectual Property Office as International Searching Authority, International Search Report and Written Opinion for PCT/CA2012/050881, Feb. 26, 2013.
United States Patent and Trademark Office, Office Action for U.S. Appl. No. 14/363,859, Aug. 19, 2015.

\* cited by examiner

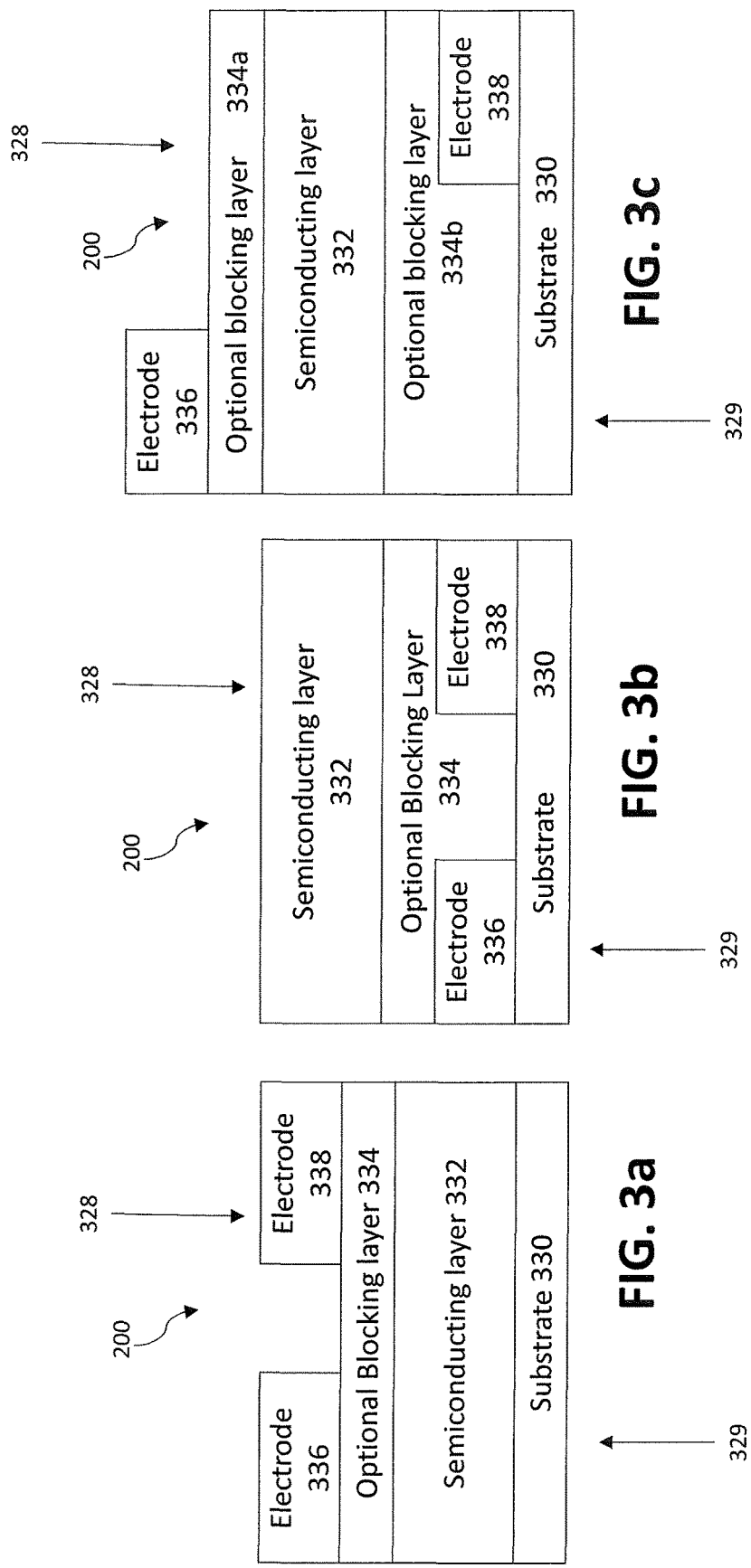

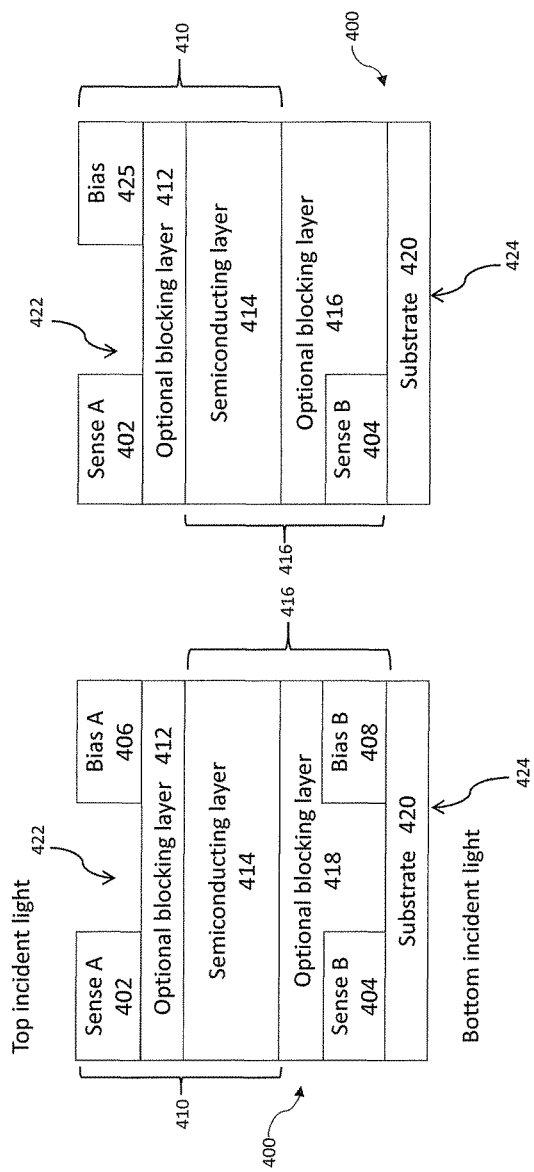

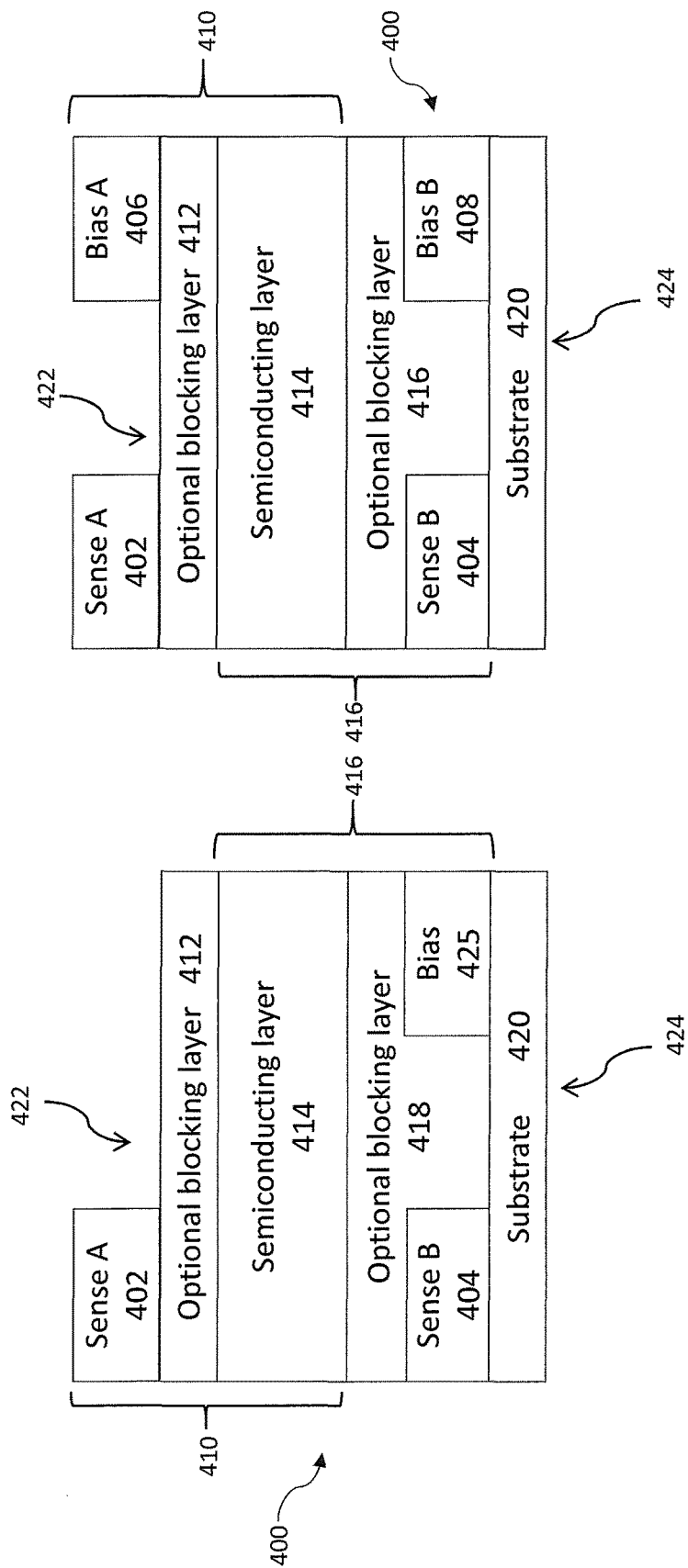

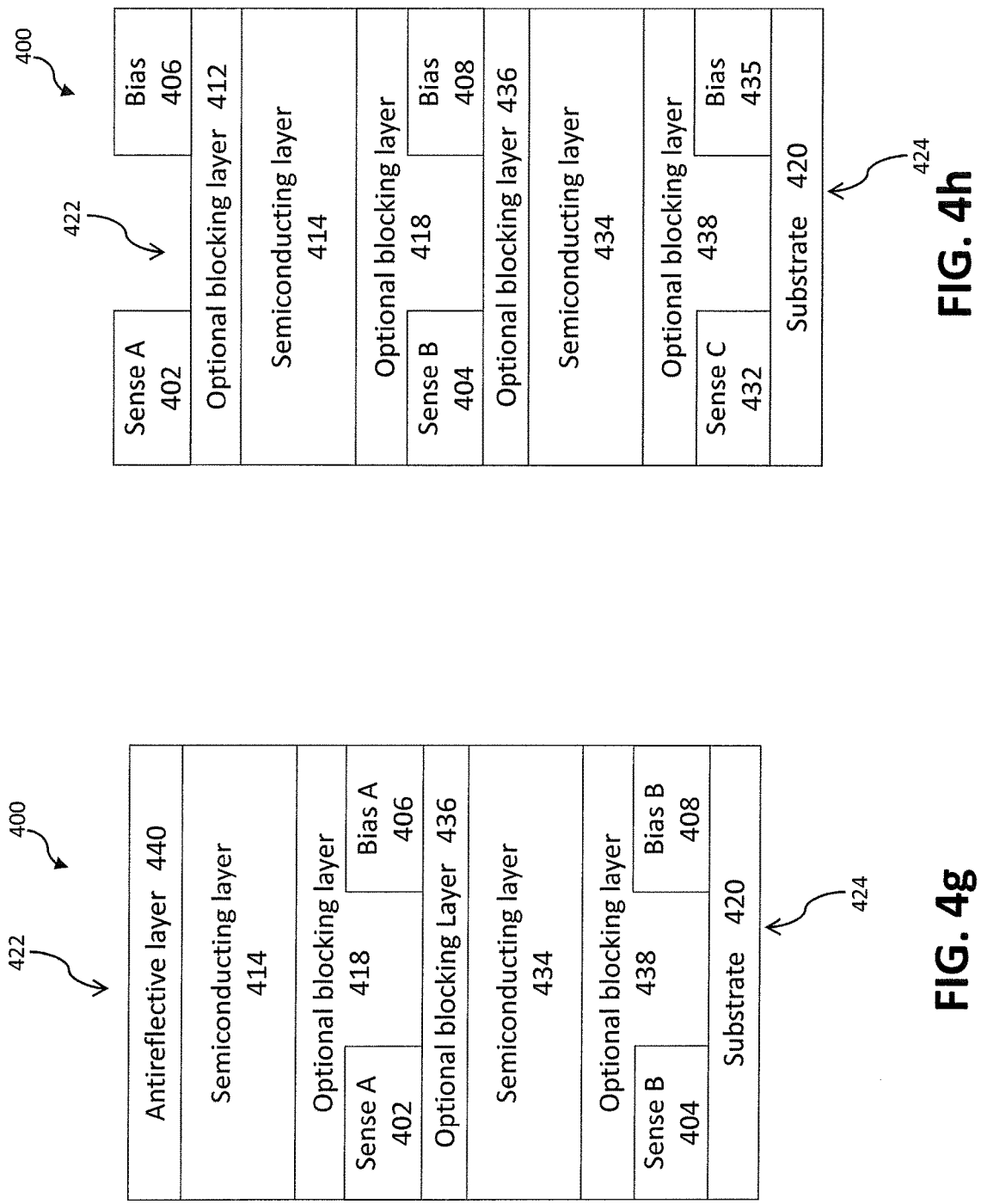

MULTI-SENSOR PIXEL ARCHITECTURE FOR USE IN A DIGITAL IMAGING SYSTEM

FIELD OF THE DISCLOSURE

The disclosure relates generally to digital imaging systems, and more particularly, to a multi-sensor pixel architecture for use in a digital imaging system.

BACKGROUND OF THE DISCLOSURE

Traditionally, X-ray diagnostic processes record x-ray image patterns on silver halide films. These systems typically direct an initially uniform pattern of impinging X-ray radiation, or X-rays, through an object to be studied, intercept the modulated pattern of X-ray radiation after the X-rays pass through the object to be studied with an X-ray radiation intensifying screen, record the modified pattern on a silver halide film, and chemically transform the latent pattern into a permanent and visible image called a radiograph.

Radiographs are produced by using layers of radiation sensitive materials to directly capture radiographic images as modulated patterns of electrical charges. Depending on the intensity of the incident X-ray radiation, electrical charges generated, either electrically or optically (indirectly via a scintillator) from the X-ray radiation, are quantized using a regularly arranged array of discrete solid-state radiation sensors.

Recently, there has been rapid development in the area of large area, flat-panel, digital X-ray imagers for digital radiology using active matrix technologies. An active matrix includes a two-dimensional array (of which, each element is called a pixel) of thin-film-transistors (TFTs) made with a large area compatible semiconductor material.

There are two general approaches to manufacturing flat-panel X-ray imagers. These approaches can be seen as a direct approach or an indirect approach. The direct approach primarily uses an amorphous selenium photoconductor as the X-ray to electric charge converting layer coupled directly to the active matrix. In the indirect approach, a phosphor screen or scintillator (e.g. CsI, GdOS etc) is used to convert X-rays to light photons which are then converted to electric charge using an additional pixel level light sensor fabricated with the TFT on the active matrix array.

Although the concept of large area dual energy X-ray imaging by stacking two X-ray imagers on top of each other has been around even in the era of computed radiography, the difficulty in acquiring a good quality image, increase in the overall time of the procedure and also the diagnostic time associated with two images, has limited its use in mainstream medicine. Stacking two imagers also drives the cost of production up linearly. More recently, with the rise of digital X-ray imagers, a technique called fast kVp switching has gained some acceptance where the X-ray source is switched within typically <100 ms between the high and low X-ray exposures while using a single digital imager to acquire the images in sequence. While a dual energy image can be obtained using this approach, this technique is susceptible to motion artifacts for example, due to patient breathing. Also, the digital imager can only be optimized to capture either the low or high-energy spectrum but this leads to a tradeoff between resolution and dose efficiency.

Commercially available flat-panel imagers are optimized to sense a single spectrum of incident X-ray energies e.g. a chest radiography imager is optimized to sense a 100 kVp spectrum or alternately, a mammography imager is designed to sense a 30 kVp spectrum. The optimization is undertaken usually by selecting an optimum thickness of the photoconductor for direct imaging or alternately, an optimum thickness of a scintillator for indirect imaging. If the scintillator is too thin, absorption efficiency suffers and if the scintillator is too thick, blurring increases.

Accordingly, there is a need for an improved digital X-ray imager.

SUMMARY OF THE DISCLOSURE

The present disclosure is directed at a system and method for a multi-sensor pixel architecture. In one embodiment, the pixel architecture is integrated in a photoconductive sensing element within a single pixel. In one aspect, this enables the creation of a next generation dual energy imager. Among its advantages, the system of the disclosure may acquire dual energy images simultaneously, may be optimized independently of each other and/or may reduce or minimize manufacturing cost. These and other advantages of the aspects of the present disclosure will be understood in conjunction with the following detailed description and accompanying drawings.

An imager capable of sensing two different energy spectrums, however, can be helpful in distinguishing between two materials of different density e.g. bone and soft tissue. Such a technique has been employed in dual energy x-ray absorptiometry (i.e. bone scans) where linear scanners are used to acquire the dual energy images. Dual energy is gaining prominence in computed tomography (CT) also where crystalline or polycrystalline detectors are interfaced to photon counting circuits that are capable of distinguishing between incident X-ray energy via two or more distinct thresholds built into the pixel circuit. However, to date, dual energy large area X-ray imagers have not gained significant traction.

The imager of the disclosure is capable of, at least one of, acquiring dual energy images simultaneously without motion artifact, is optimized for spatial resolution and dose efficiency when acquiring both high and low energy X-ray spectrums, and does not drive up the cost of production like a conventional imager stacking approach.

In one aspect of the disclosure, there is provided a detector element for use in a digital imaging system, the detector element including at least one semiconducting layer for absorbing radiation incident on opposite sides of the at least one semiconducting layer; and a set of electrodes located on one side of the at least one semiconducting layer for transmitting a signal associated with the radiation absorbed by the at least one semiconducting layer. The signal is then transmitted to a set of readout electronics. In another aspect, the set of electrodes includes a sense electrode and a bias electrode. In yet a further aspect, the sense electrode and the bias electrode are spaced apart laterally. The detector element may also include a blocking layer situated between the set of electrodes and said semiconducting layer.

In another aspect, there is provided a detector element for a digital imaging system, the detector element including at least one top electrode metal-semiconductor-metal (MSM) detector; and at least one bottom electrode MSM detector; wherein said at least one top electrode MSM detector and said at least one bottom electrode MSM detector share a common semiconducting layer. In another aspect, the op electrode MSM detector includes the semiconducting layer; and a top electrode MSM detector set of electrodes patterned on a top electrode side of the semiconducting layer. In another aspect, the top electrode MSM detector further includes a blocking layer deposited between the semiconducting layer and the top electrode MSM detector set of electrodes.

In another aspect, the bottom electrode MSM detector includes the semiconducting layer; and a bottom electrode MSM detector set of electrodes patterned on a bottom side of the semiconducting layer; the bottom side of the semiconducting layer opposite the top side of the semiconducting layer.

BRIEF DESCRIPTION OF THE DRAWINGS

Embodiments of the disclosure will now be described, by way of example only, with reference to the attached drawings, in which:

FIGS. 3a to 3c are schematic diagrams of MSM detectors;

FIGS. 4a to 4j are schematic diagrams of hybrid MSM photoconductor elements;

DETAILED DESCRIPTION

The following description is presented to enable one of ordinary skill in the art to make and use the disclosure and is provided in the context of a patent application and its requirements. Various modifications to the embodiments will be readily apparent to those skilled in the art and the generic principles herein may be applied to other embodiments. Thus, the present disclosure is not intended to be merely limited to the embodiment shown but is to be accorded the widest scope consistent with the principles and features described herein.

The present disclosure relates to a pixel architecture, preferably for use in a digital imaging system, which includes a multi-sensor metal-semiconductor-metal (MSM) detector integrated with a switching, or photoconductive, element for a digital imaging system. In a preferred embodiment, the digital imaging system is a radiography imaging system.

Examples of metal-semiconductor-metal (MSM) detectors are described in the following publications: (1) S. Ghanbarzadeh, S. Abbaszadeh and K. S. Karim, "Low dark current amorphous silicon Metal-Semiconductor-Metal photodetector for digital imaging applications", IEEE Electron Device Letters (2014) and (2) U.S. Pat. No. 9,269,838 B2 entitled Radiation detector system and method of manufacture, which are hereby incorporated by reference.

Figure 1A:
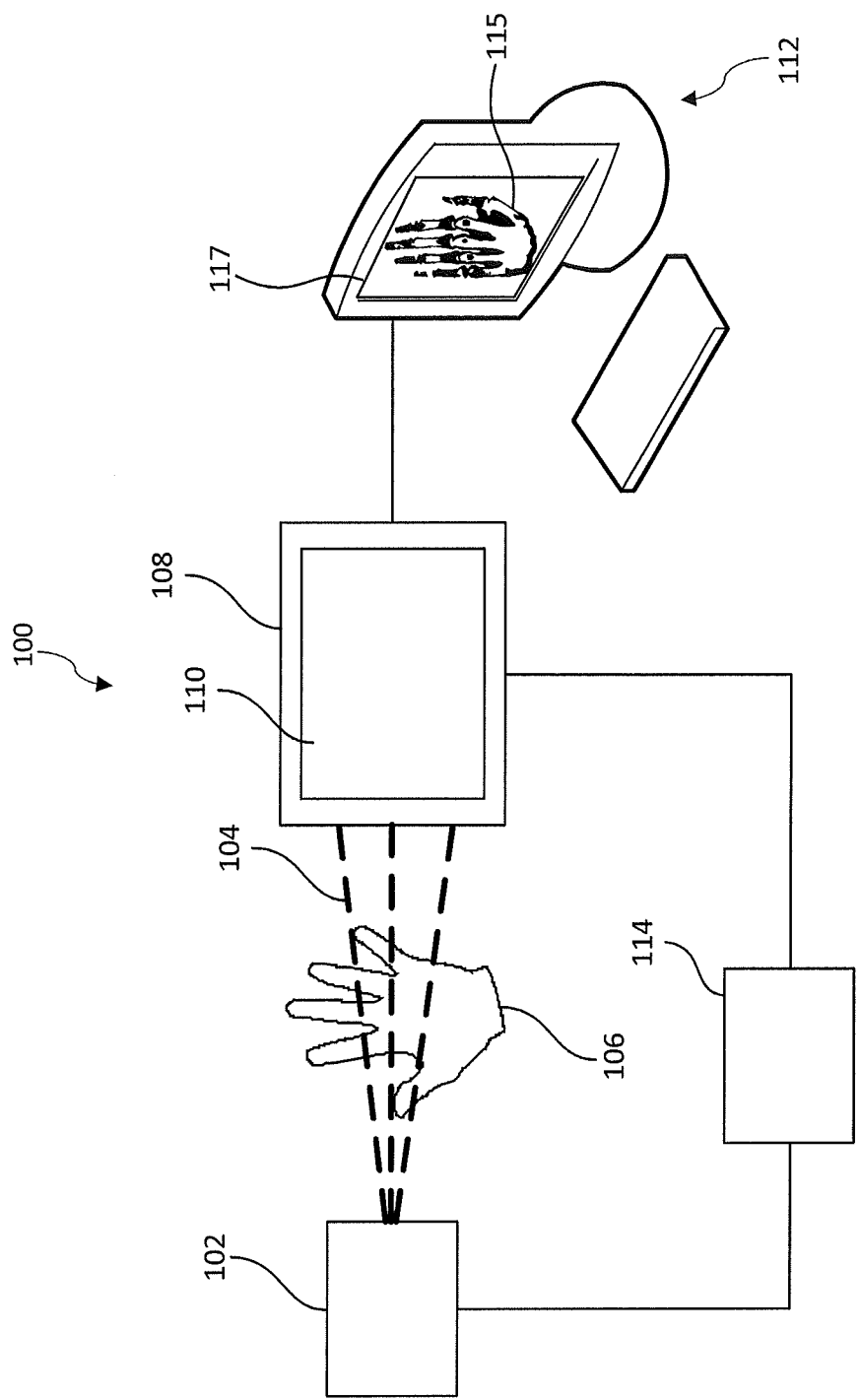
FIG. 1a illustrates a schematic diagram of a system for radiographic imaging.

FIG. 1a illustrates a schematic diagram of a radiographic imaging environment, or system. The system 100 includes an X-ray radiation source 102 that generates X-ray radiation, in the form of a set of X-ray beams 104, that is transmitted towards an object of interest 106 such as a patient's hand, for imaging by a radiography detector system 108. In the present disclosure, the radiography detector system 108 preferably includes a large area, flat-panel detector based on active matrix technologies to achieve, or produce an image of the object 106. In general, the object 106 to be imaged is positioned between the X-ray radiation source 102 and the radiography detector system 108. X-rays, which pass through the object 106, interact with the radiography detector system 108.

In direct imaging, the X-rays generate electronic charge within the radiography detector system 108 such that there is no need for a scintillator 110. In indirect imaging, the X-rays generate light photons as they pass through a phosphor screen or scintillator 110 within the radiography detector system 108. Different materials are contemplated for the scintillator including, but not limited to, Caesium Iodide (CsI), Gadolinium oxysulfide (GOS) or Calcium Tungsten Oxide ($CaWO_4$). These indirectly generated light photons then further generate electronic charge within the radiography detector system 108.

The image 115 that is produced by the radiography detector system 108 can then be viewed on a display 117 of a computer 112 or computing system. For some radiography detector systems 108, synchronization hardware 114 may be necessary to obtain the correct timing between the X-ray source 102 and the radiography detector system 108 that is sampling the impinging set of X-ray beams 104.

Figure 1B:
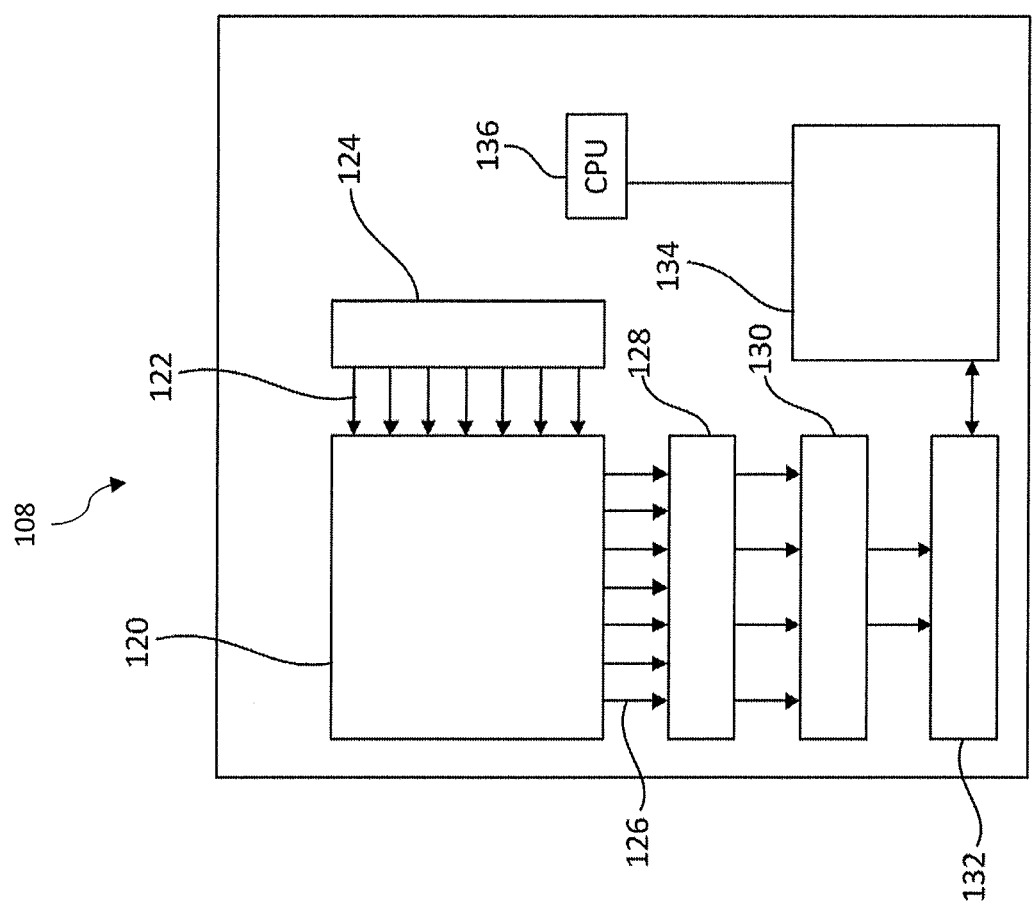
FIG. 1b is a schematic diagram of a radiography detector system.

FIG. 1b is a schematic diagram of components of one embodiment of a radiography detector system. In the current embodiment, the radiography detector system 108 includes an active matrix pixel array 120 having a two-dimensional matrix of pixel elements where electronic charges generated, directly or indirectly, by incident X-rays are sensed and stored. To access the stored charge at each pixel, gate lines 122 are driven, preferably sequentially, by a row switching control or controller 124 causing all pixels in one row of the active matrix pixel array 120 to output their stored charge onto data lines 126 that are coupled to charge amplifiers 128 at the end of each active matrix pixel array 120 column. The charge amplifiers 128 may also perform a multiplexing function in addition to the amplifying function. The charge amplifiers 128 send the pixel charge data to analog-to-digital converters (A/D's) 130, where the analog signal is converted to a digital representation. These digital representations are then stored in memory 132 awaiting transmission to the computer 112 at a time determined by the control logic 134. The transmission of the digital representations may be performed by a processor or central processing unit (CPU) 136.

Figure 2:
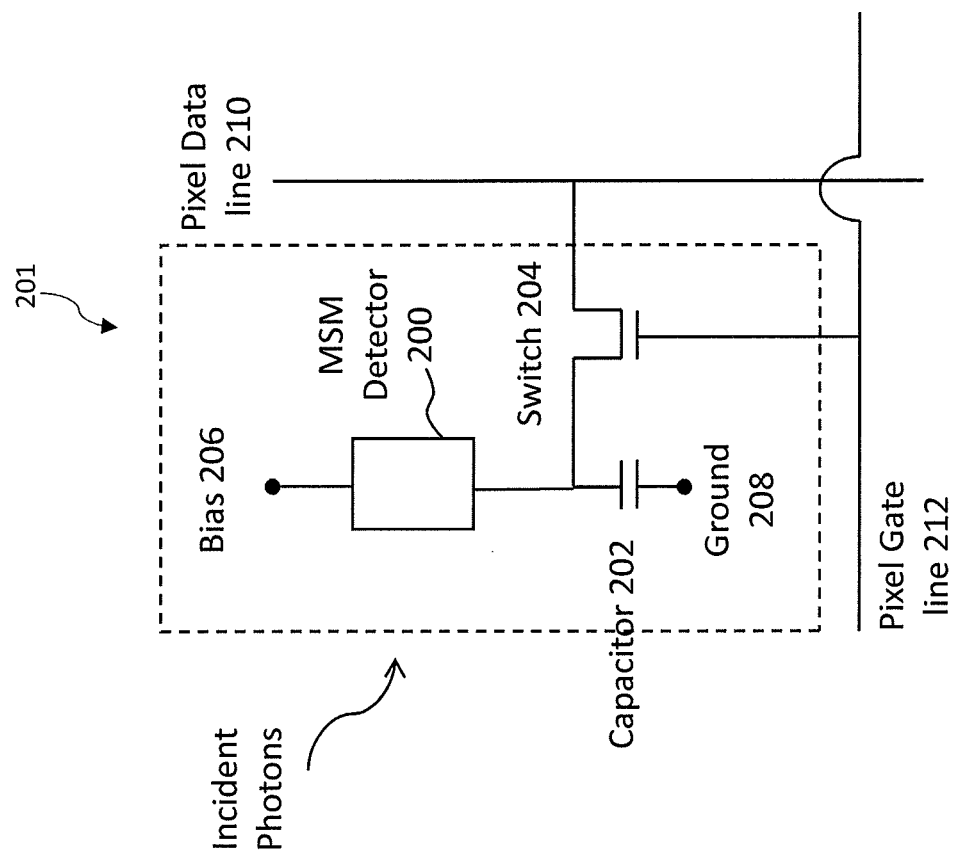
FIG. 2 is a two-dimensional active matrix imaging array structure.

FIG. 2 is a schematic diagram of a pixel level circuit for a pixel within the active matrix pixel array 120 of FIG. 1b. Within each pixel 201 is a two terminal metal-semiconductor-metal (MSM) or metal-insulator-semiconductor-insulator-metal (MISIM) detector 200 that absorbs the incident X-ray photons and generates electronic charge, a two-terminal capacitor 202 to store converted electronic charge and a switch 204, typically a three electrode thin-film-transistor (TFT) switch, for transferring the electronic charge off the pixel. It will be understood that the capacitor 202 is an optional component within this pixel 201. For clarity sake, when the description refers to a MSM detector, a MISIM detector may also be contemplated.

One electrode of the MSM detector 200 is connected to a high potential bias terminal 206 that is shared with other pixels in the active matrix pixel array 120 and another of the electrodes is connected to the capacitor 202. The capacitor 202 is also connected to a low potential ground terminal 208 which is also shared with other pixels in the active matrix pixel array 120. The drain electrode of the TFT 204 is connected to one of the electrodes of the MSM detector 200 and one of the terminals of the capacitor 202. The source electrode of the TFT 204 is connected to a pixel data line 210 which is coupled to one of the plurality of data lines 126 described in FIG. 1*b*. The gate electrode of the TFT 204 is connected to a pixel gate line 212 which is coupled to one of the plurality of gate lines 122 described in FIG. 1*b*.

Turning to FIG. 3*a*, a schematic cross-section diagram of a first embodiment of the MSM detector 200 is shown. In this embodiment, the MSM detector 200 may be seen as being in a top electrode configuration. The MSM detector 200 includes a substrate layer 330 such as, but not limited to, glass, steel, aluminium or plastic, with a semiconducting layer 332 deposited atop the substrate layer 330. The material for the semiconducting layer 332 is preferably selected from one of amorphous silicon, polysilicon, microcrystalline silicon, epitaxial silicon, amorphous selenium, crystalline selenium, molybdenum sulfide, metal oxide semiconductors, silicon nanowires (for example, to sense infrared wavelengths with high quantum efficiency), or an organic semiconductor, although other materials may be contemplated. Atop the semiconducting layer 332, an optional blocking layer 334 is deposited and then a patterned contact layer yielding at least two electrodes is located atop the optional blocking layer 334. In the absence of the optional blocking layer 334, the contact layer is deposited atop the semiconducting layer 332. In the current embodiment, the at least two electrodes include one sense contact or electrode 336 and one bias contact or electrode 338. It will be understood that the electrodes 336 and 338 may be switched whereby electrode 336 is the bias contact and electrode 338 is the sense electrode. In an alternative embodiment, ohmic or Schottky contacts may be used as the electrodes. In a preferred embodiment, the layers may be deposited in a pre-determined sequence on top of the substrate layer 330. In this embodiment, the pre-determined sequence is the semiconducting layer 332, the optional blocking layer 334 and then contact layer with the two electrodes 336 and 338. In use, the MSM detector 200 receives and processes top incident light 328 and bottom incident light 329.

The optional blocking layer 334 can be any one of ohmic, Schottky or insulating layer varieties. In particular, insulating or wide bandgap semiconductor blocking layers such as, but not limited to, polyimide, polystyrene, PVK, silicon nitride, silicon oxide, silicon oxynitride, Molybdenum Sulfide or transparent metal oxides (such as Indium Gallium Zinc Oxide, Zinc Oxide) can be advantageous in reducing the dark current while maintaining high photocurrent and sensitivity. Although not shown, an optional anti-reflective layer may be deposited atop the substrate layer 330 prior to deposition of the semiconducting layer 332. While the anti-reflective layer is not necessary for operation of the MSM detector 200, in an indirect conversion imaging system, the anti-reflective layer may enhance system performance by increasing the percentage of light photons impinging on the semiconducting layer 332 where photons are absorbed. If an insulating or wide bandgap semiconductor is used as the blocking layer, it can also provide the functionality of an anti-reflective layer.

In FIG. 3*b*, a schematic cross-section diagram of a second embodiment of a MSM detector 200 is provided. The MSM detector 200 of FIG. 3*b* may be seen as a bottom electrode configuration. In the current embodiment, the deposition of the layers atop the substrate layer 330 may be reversed with respect to the embodiment of FIG. 3*a*. Firstly, an electrode layer patterned to realize a pair of contacts (or electrodes) is deposited on the substrate layer 330. These electrodes may be the sense 336 and bias 338 contacts or electrodes. The deposition of the electrodes is followed by the deposition of an optional blocking layer 334 and the semiconducting layer 332. Although not shown, an optional anti-reflective layer may be deposited atop the semiconducting layer 332. Each of the layers will perform similar functions as disclosed above with respect to FIG. 3*a*.

Turning to FIG. 3*c*, a schematic cross-section diagram of another embodiment of a MSM detector 200 is shown. The embodiment of FIG. 3*c* may be seen as a staggered electrode embodiment. In this embodiment, the sense 336 and bias 338 contacts are placed on opposite sides of the semiconducting layer 332 but spaced apart laterally. Although FIG. 3*c* shows the sense electrode 336 in a position above the bias electrode 338, it will be understood that this may be reversed with the bias electrode 338 in a position above the sense electrode 336. The MSM detector 200 further includes a pair of optional blocking layers 334 on either side of the semiconducting layer 332. With the bias electrode 338, the optional blocking layer 334*b* encapsulates the bias electrode 338 while with the sense electrode 336, the electrode 336 is atop the other optional blocking layer 334*a*.

In FIG. 4*a*, a schematic diagram of a cross-section of a first implementation of a hybrid MSM (HMSM) photoconductive element is shown. In the current embodiment, the photoconductive element 400 includes at least four electrodes seen as sense electrode A 402, a sense electrode B 404, a bias electrode A 406 and a bias electrode B 408. In an alternative embodiment, further electrodes may be included and arranged in a comb configuration as would be understood by one skilled in the art.

The hybrid photoconductive element 400 includes a top electrode MSM detector 410 including sense electrode A 402, bias electrode A 406, optional blocking layer 412 and the semiconducting layer 414 and a bottom electrode MSM detector 416 including sense electrode B 404, bias electrode B 408, optional blocking layer 418 and semiconducting layer 414. The top electrode MSM detector 410 is similar to the embodiment shown in FIG. 3*a* and the bottom electrode detector MSM 416 is similar to the embodiment shown in FIG. 3*b*.

As can be seen, the top 410 and bottom 416 MSM detectors share the common semiconducting layer 414 and a common substrate 420. Due to the combination of the two types of electrode MSM detectors, the photoconductive element 400 may be seen as a hybrid MSM (HMSM) structure including a plurality of MSMs. The HMSM or photoconductive element 400 of FIG. 4*a* is able to sense light from opposite sides of the semiconducting layer 414 simultaneously i.e. top incident light 422 is sensed by the top electrode MSM detector 410 and bottom incident light 424 is sensed by the bottom MSM detector 416.

Generally, dark current is an issue with MSM detectors that do not employ blocking layers or at the very least, some kind of treatment of the electrodes, such as silicidation. Dark current is known to reduce the dynamic range, (or alternately, the range of input signal amplitudes the detector is sensitive to) of the detector and the resultant quality of the image being produced. Dark current is a function of the electric field applied on the bias contacts, or electrodes 406 and 408. A large electric field is necessary for charge separation of the electronic carriers generated by the impinging X-ray photons or beams on the semiconducting layer 414. If photocurrent is maintained at a high level while dark current is reduced or if a higher electric potential is applied to the bias contacts 406 and 408 to increase charge separation efficiency and, correspondingly, the photocurrent, without increasing the dark current, then a larger photo-to-dark current ratio is possible which results in an improved dynamic range, higher contrast, higher quantum efficiencies and better digital images.

In experiments, the current design when the top MSM detector 410 includes an insulating or wide bandgap semiconductor blocking layer 412 and the bottom MSM detector 416 includes an insulating or wide bandgap semiconductor blocking layer 418, certain advantages were achieved or recognized. These benefits included, but are not limited to, reduced dark currents when there are no X-ray photons impinging on the semiconducting layer 414 and high photocurrent enabled when X-ray photons impinged on the semiconducting layer 414.

In one embodiment, in order to achieve, or recognize, these two advantages, the characteristics of the blocking layers 412 and 418 were carefully determined (both material type and thickness) to provide a low defect density interface with the semiconducting layer 414 and to have a dielectric strength for device operation at high fields. Furthermore, the semiconducting layer 414 thickness and the blocking layer 412 and 418 thicknesses were selected to take into account both the dark conductivity and photoconductivity of the semiconducting layer 414 (a function of semiconducting layer 414 thickness), applied electric bias and material properties.

When X-ray photons are impinging on the semiconducting layer 414 (thereby causing the resistivity of the semiconducting layer 414 to decrease), the blocking layers 412 and 418, at the higher electric fields, permit, or allow for, a vertical conduction path from the respective bias electrodes 406 and 408 to respective sense contacts 402 and 404 through the respective blocking layers 412 and 418 to the semiconducting layer 414. In the dark, the resistivity of the semiconducting layer 414 is high making the electric field across the blocking layers 412 and 418 lower thus reducing or preventing any injection of current from the bias and/or sense contacts.

In a preferred embodiment, the characteristics of the blocking layers 412 and 418 are selected such that they can also overcome the response time challenge while still maintaining a low dark current by limiting bias 406 and 408 and sense 402 and 404 contact injection currents. Using a blocking layer 412 or 418 that is too thick or with a high dielectric breakdown strength may yield poor results. Alternatively, choice of an incompatible blocking layer 412 or 418 material can yield a poor interface with the semiconducting layer 414 so that traps and defects may cause a drop in the HMSM quantum efficiency.

For example, during experiments, it was determined that using an amorphous silicon semiconducting layer 414 of a thickness of at least 4000 nm works well with 100-300 nm polyimide blocking layers 412 and/or 418 and yields a good quality, or improved, interface with high external quantum efficiency (above 65%). If the semiconducting layer 414 is changed from amorphous silicon to a metal oxide, such as indium gallium zinc oxide (IGZO) or even polysilicon, both of which have different material properties and absorption coefficients, different characteristics for the blocking layers (for interface purposes), thickness and maximum bias voltage applied are necessary, or preferred.

Moreover, a continuous blocking layer 412 or 418 as opposed to simply patterning the insulating contacts around the bias electrodes 406 or 408 and sense contacts 402 or 404 can lead to a better overall interface with the semiconductor layer 414 with fewer defects and traps as well as encapsulating the semiconducting layer 414 thereby maintaining a higher quantum efficiency. A patterning process may degrade the semiconducting layer 414 interface due to its exposure to air and chemicals during the patterning process. However, for certain applications, patterning is necessary and preferred as would be appreciated by one skilled in the art.

Furthermore, if the bias electrodes 406 and 408 and sense electrodes 402 and 404 are made using transparent materials, the blocking layers 412 and 418 may serve an additional function such as being anti-reflective layers, which allow additional X-ray photons to reach the semiconducting layer 414 through transparent contacts or electrodes. Alternately, discrete anti-reflective (AR) coatings 426, 428 and 430 can be used, such as shown in FIG. 4e.

FIGS. 4b and 4c show alternate configurations of a hybrid MSM structure, or photoconductive element, where there is a single bias electrode bias electrode 425 placed on the same plane as the sense electrode A 402 (FIG. 4b) or sense electrode B 404 (FIG. 4c). FIG. 4d represents another variant of the photoconductive element where the bias electrode A 406 and bias electrode B 408 do not differ in physical placement as compared to the embodiment of FIG. 4a, however, they are connected to the same potential unlike the embodiment of FIG. 4a where the bias electrodes 406 and 408 may be set at different potentials.

Figures 4E, 4F:
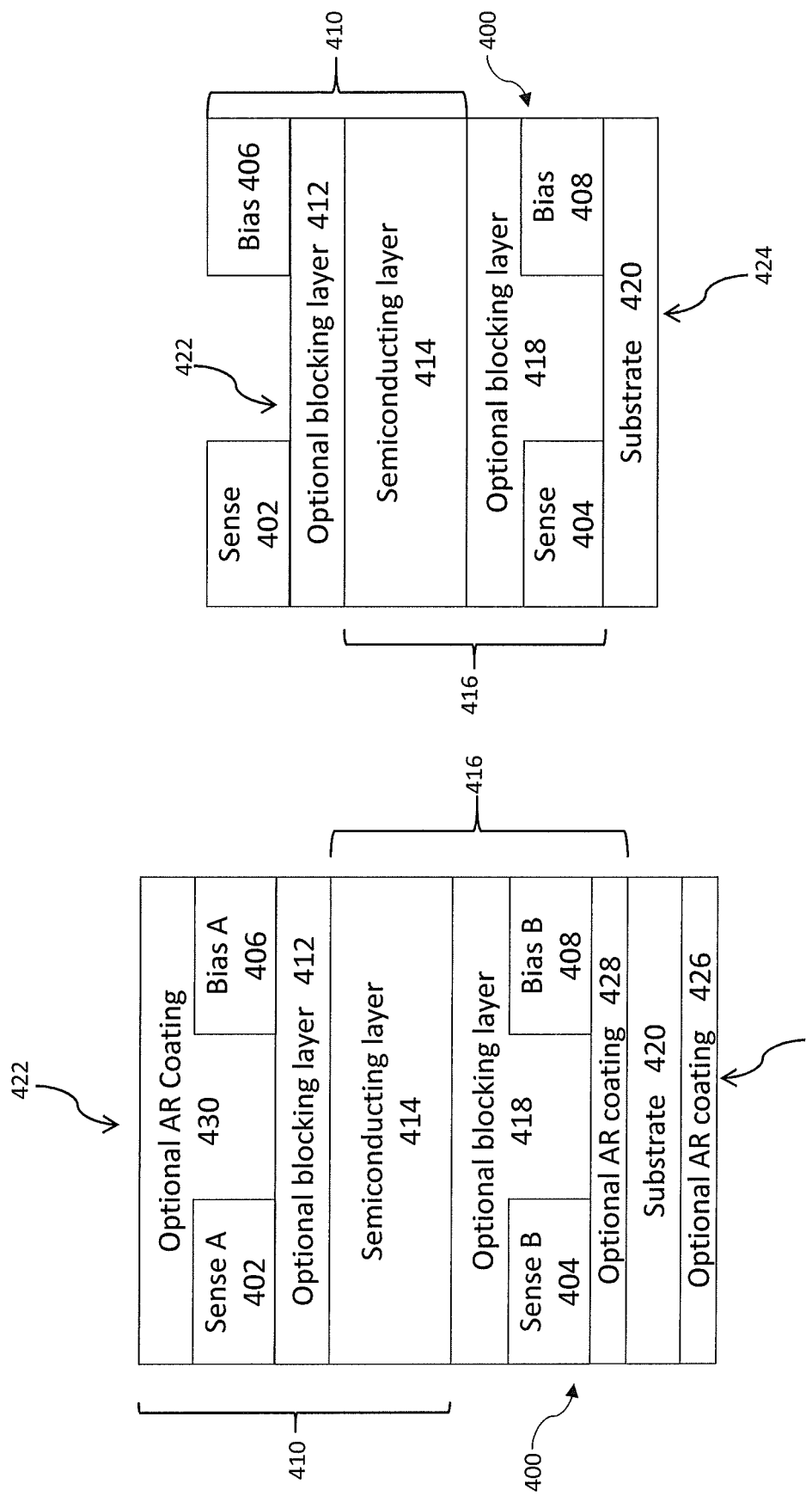

FIG. 4f is a schematic cross-section of yet a further embodiment of a photoconductive element. Similar to the embodiment of FIG. 4d, the sense electrodes 402 and 404 are preferably connected to yield a single sense electrode (or two sense electrodes at the same potential) albeit on two sides of the semiconducting layer 414. To yield a single sense electrode, a connection between electrodes on either side of the semiconducting layer can be accomplished by using a via. The structure of FIG. 4f can enable a higher sensitivity due to better control of the electric field. The embodiment of FIG. 4f also includes the blocking layers 412 and 418, a semiconducting layer and a substrate 420 along with bias electrodes 406 and 408.

FIGS. 4g and 4h are further cross sections of other embodiments of a photoconductive element 400. In these embodiments, the MSM detectors are stacked on top of each other. In these embodiments, the process complexity is also increased.

In FIG. 4g, the photoconductive element 400 includes a set of sense electrodes 402 and 404 along with a set of bias electrodes 406 and 408. Atop the substrate layer 420 is an optional blocking layer 438 on which a semiconducting layer 434 is deposited. A further pair of optional blocking layers 436 and 418 is then deposited atop the semiconducting layer 434 with one of the blocking layers 418 encapsulating the sense electrode 402 and bias electrode 406. A further semiconducting layer 414 is deposited atop the optional blocking layer 418. Finally, in the current embodiment, an anti-reflective layer 440 is deposited atop the semiconducting layer 412.

In FIG. 4h, there are three sense electrodes 402, 404 and 432 providing for the ability to sense three different signals using a single photoconductive element 400. For example, for top incident light 422 impinging from the top of the element 400, the element 400 of FIG. 4h can help discriminate between different optical wavelengths by sensing the depth of absorption in the semiconducting layers 414 and 434. In one example, the top semiconducting layer 414 can sense shorter blue and green wavelengths while longer wavelengths like red or near infrared could be absorbed in the bottom semiconducting layer 434. This type of discrimination is one factor for accurate biometric fingerprint or hand scanning where a multi-spectral sensor can help distinguish between a live finger and a model by making use of red light that penetrates the human skin or even for multi-energy X-ray imaging as will be described later on. The element 400 also includes three bias electrodes 406, 408 and 435 along with a set of a set of optional blocking layers 412, 418, 436 and 438.

Figure 4J:
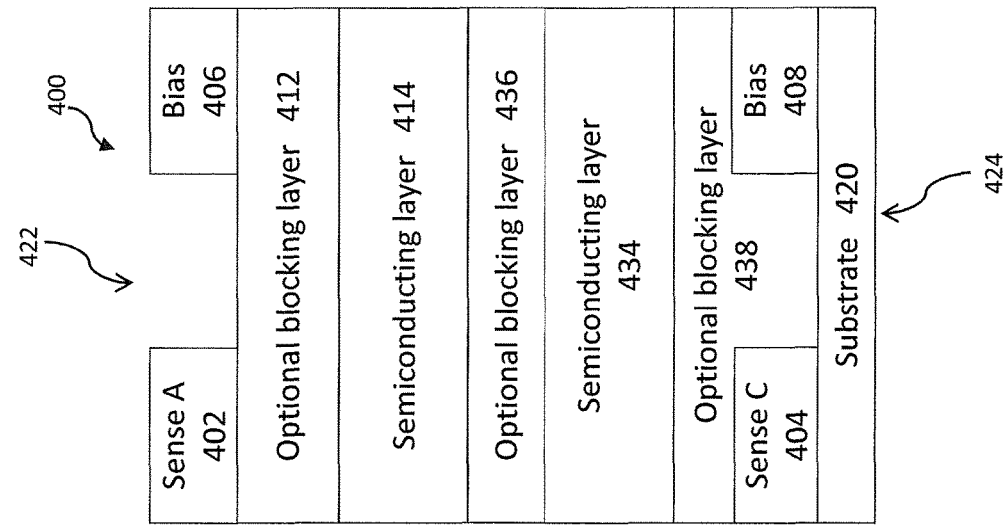
Figure 4I:
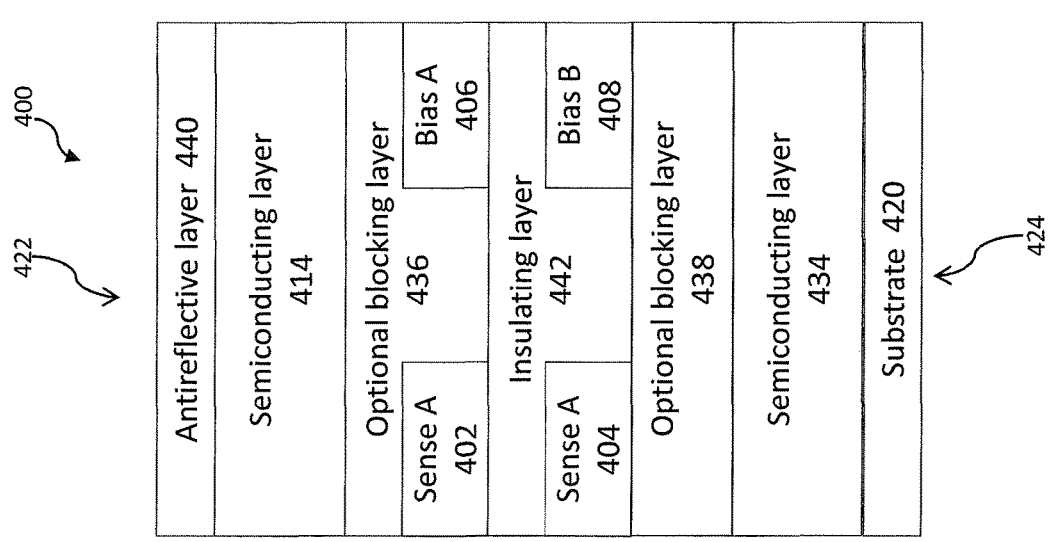

Turning to FIG. 4i, the photoconductive element 400 includes an anti-reflective layer 440 atop a first semiconducting layer 414. An optional blocking layer 418, on the other side of the first semiconducting layer 414, encapsulates the sense 402 and bias 406 electrodes. An insulating layer 442, encapsulating the sense 404 and bias 408 electrodes, is located between the optional blocking layer 418 and another blocking layer 438. Between the blocking layer 438 and the substrate layer 420 is a second semiconducting layer 434.

In the embodiment of FIG. 4j, a set of sense 402 and bias 406 electrodes is located atop a blocking layer 412 which along with a pair of other blocking layers 436 and 438 sandwich a pair of semiconducting layers 414 and 434 atop a substrate layer 420.

In each of the HMSM structures shown in FIG. 4, different applications may be appreciated. For example, in the consumer display field, as the HMSM detectors or photoconductive elements of the disclosure can sense light from both sides of the semiconducting layer, these devices can give rise to dual-sided gesture sensitive or touch displays. In manufacture, any number of MSM or HMSM detectors can be stacked on top of each other (although the process complexity could increase) as shown in FIGS. 4g to 4j. These types of HMSM stacks can enable either enhanced spectral separation or sensing more than two wavelengths at the same time (for example, infrared and/or color).

Figure 5A:
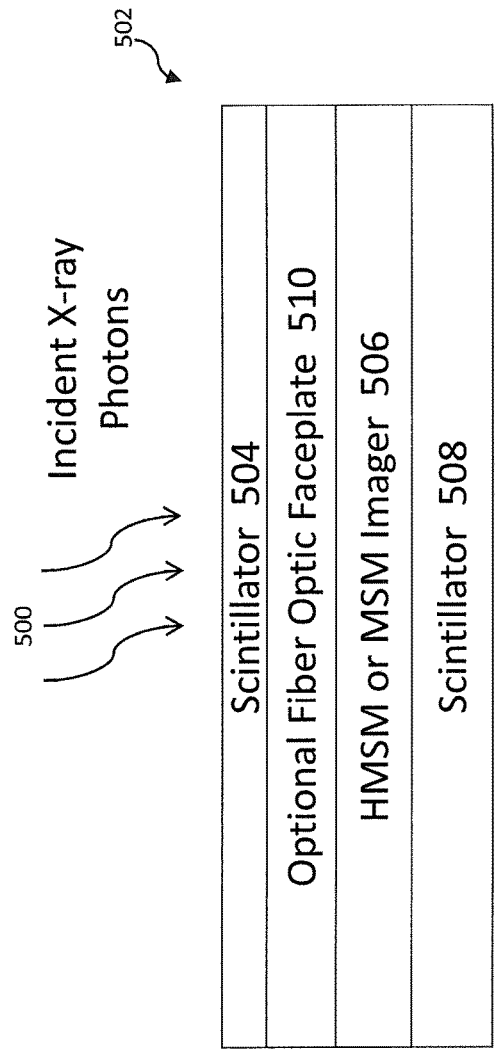
FIGS. 5a to 5d are schematic diagrams of dual X-ray imaging systems.

Detecting optical, or light, photons from both sides of the semiconducting layer 414 can also be used for a higher performance dual energy X-ray imaging system such as schematically shown in FIG. 5a. In this embodiment, a set of X-ray beams 500 containing a spectrum of low, mid and high energies is incident on the X-ray detector 502. A top scintillator 504 (absorbing the low energy incident X-ray photons) is placed on top of a digital imager 506 employing either a MSM or HMSM detector (such as disclosed above with respect to FIGS. 3a to 3c or 4a to 4j). A bottom scintillator 508 is placed behind the imager 506 and absorbs the mid and high energy X-ray photons that are not absorbed in the top scintillator 504. Using a HMSM imager 506 enables simultaneous detection of high and low X-ray energies to remove or eliminate motion artifact.

For the application of dual energy X-ray imaging, the HMSM imager 506 is preferably used with a fiber optic faceplate 510 (adapted to serve as a mid-filter) that is placed between the top scintillator 504 and bottom scintillator 508. The faceplate 510 can be placed adjacent to the top scintillator 504 (as shown in FIG. 5a) or alternately, between the HMSM imager 506 and the bottom scintillator 508. One unique property of the fiber optic faceplate 510 is that it is capable of absorbing some incident X-ray photons 500 but also permits light from the top scintillator 504 to be transmitted to the HMSM imager 506. In other words, the faceplate can improve the detection being performed by the system 502.

In some circumstances, fiber optic faceplates are used with CMOS X-ray imagers where they are designed to reduce the amount of X-ray damage to CMOS X-ray imagers from photons that are not fully absorbed in the overlying scintillator layer. In the current disclosure, the fiber optic faceplate 510 is being used as a mid-filter to filter mid-energy X-rays for dual energy imaging which is different than its use in CMOS X-ray imagers.

Since the top scintillator 504 is converting incident X-ray photons into light photons, there is a desire that these light photons reach the top of the HMSM imager 506 for sensing. The mid-filter 510 or faceplate assists to filter out the mid-energy X-ray photons to allow for better or improved spectral separation between the lower and higher X-ray energies. In one embodiment, the top scintillator 504 can be silvered on the top to reduce or minimize light loss through the top and hence enhance light collection within the top electrode of the imager 506. Similarly, the bottom scintillator 508 can be silvered on the bottom to reduce or minimize light loss through the bottom. Light photons generated in the bottom scintillator 508 are to be sensed by the bottom electrodes of the HMSM imager 506.

Figure 5B:
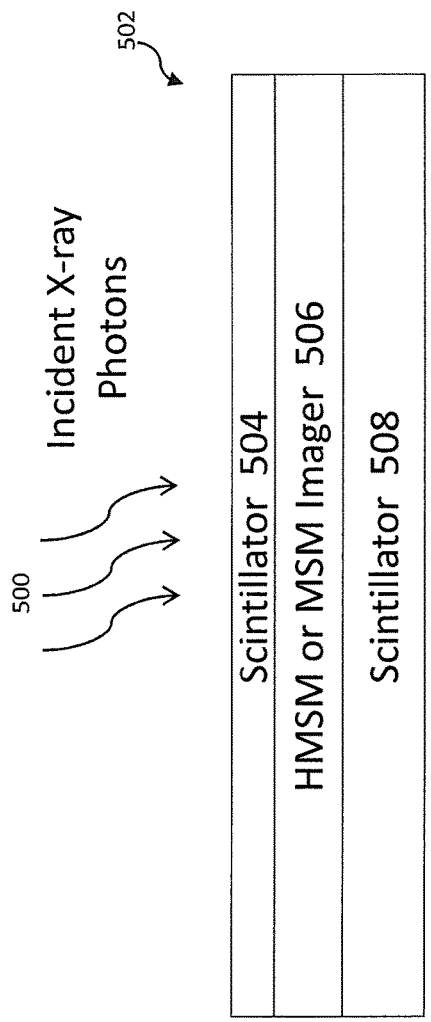

Using an imaging system 502 such as schematically shown in FIG. 5b may enable higher, or improved, performance fast-kVp dual energy imaging where the low and high energy X-ray images are detected sequentially by using the top scintillator 504 optimized or directed for low energy X-rays and the combination of top 504 and bottom 508 scintillators optimized or directed for high energy X-rays. In the traditional fast-kVp switching approach, the high and low energy images are detected by the same X-ray imager so optimization for either high or low energy is challenging. In the current system, the X-ray system includes two distinct imagers to handle both high and low energies.

Even in a traditional single X-ray energy spectrum application, use of a pair of scintillators on opposite side of the MSM or HMSM imager 506 can increase functionality, higher dose efficiency, higher spatial resolution or lower cost. For example, in FIG. 5b, the MSM or HMSM imager 506 is shown without a faceplate. In this embodiment, the spectral separation of a single incident X-ray spectrum would not typically be considered sufficient for a dual energy application, however, by choosing two different thicknesses for the top scintillator 504 and bottom scintillator 508, the imager 506 may be designed to be sensitive to two different X-ray energy spectrums depending on which side the photons are incident upon. In other words, the imaging system may be able to detect X-ray photons simultaneously impinging on both sides of the imager 506.

For example, an X-ray imager 506 could be optimized for 60 kVp for pediatric imaging on the top side and 120 kVp or typical chest radiography on the opposite side thus serving a dual purpose in the diagnostic room. Alternately, a 50 um pixel pitch imager could be used for high-resolution lower X-ray energy mammography from the top side and the pixels could be binned (e.g. to 100 um×100 um) for use in higher energy, lower resolution, chest X-ray from the bottom side. This type of dual functionality can help reduce the cost of ownership of a digital X-imager or system ray in underserved regions and lower volume clinics and healthcare centers.

An advantage of the current disclosure is that it enables detection of light from both sides of the substrate or semiconducting layer in a lateral orientation, which exposes the semiconducting layer of the imager or photoconductive element to incident light from both the top and bottom directions without significant impact from contact shadowing. To increase or maximize the light being sensed from both sides, transparent electrodes are preferred for the imager 506, however, if this is not feasible, then the staggered MSM in FIG. 3c may be used within the imager 506.

Higher energy X-rays generally require thicker scintillators to absorb all incident photons, however, thicker scintillators do not provide the best spatial resolution due to light scattering. The spatial resolution and dose efficiency tradeoff is especially pronounced in traditional scintillators like gadolinium oxysulphide (GOS:Tb) and to some extent, for structured CsI:Tl as well. For structured CsI:Tl scintillators, the deposition processes and equipment are typically not designed to exceed 1 mm deposition thicknesses limiting the dose efficiency for X-ray energies of 160 keV or higher e.g. in non-destructive test applications. The architecture shown in FIG. 5b can also be used to increase dose efficiency. In one implementation for high X-ray energy imaging, some of the incident X-ray photons are absorbed in the top scintillator 504 while the rest pass through the MSM imager 506 and are absorbed in the bottom scintillator 508 to yield a higher dose efficiency as compared to a traditional X-ray imager with only one scintillator.

The architecture or system of FIG. 5b may also improve the spatial resolution of scintillators without compromising or affecting dose efficiency. For example, instead of a single thick (e.g. 1 mm) scintillator to detect X-rays photon incident on the top, two half size (e.g. 0.5 mm) scintillators can be used, one on the top 504 and the other on the bottom 508. Splitting a thick scintillator layer into two thinner layers improves spatial resolution because the X-ray generated optical photon spread is limited to only the half thickness instead of the full. This approach is useful for cost reduction. For example, GOS scintillator is well known to be considerably less expensive than structured CsI although its spatial resolution characteristics are poorer thus it is not chosen for high resolution imaging applications. However, using two half thickness GOS scintillators in the architecture shown in FIG. 5b may achieve a spatial resolution closer to CsI but at a considerably lower manufacturing cost.

Lastly, the architectures shown in FIGS. 5a and 5b rely on incident X-ray photons 500 that are absorbed in two scintillators that create light photons striking the MSM or HMSM structure 506 from opposite sides. It would be understood to one skilled in the art that the MSM or HMSM imager resides on a substrate layer (e.g. glass, plastic, steel, aluminium etc) as in FIG. 3 (substrate layer 330) or FIG. 4 (substrate layer 420) and in order to reduce or minimize detrimental blurring effects, the substrate layer is preferably thin (e.g. Corning Willow glass or similar) or purposefully thinned to achieve improved performance.

Figure 5C:
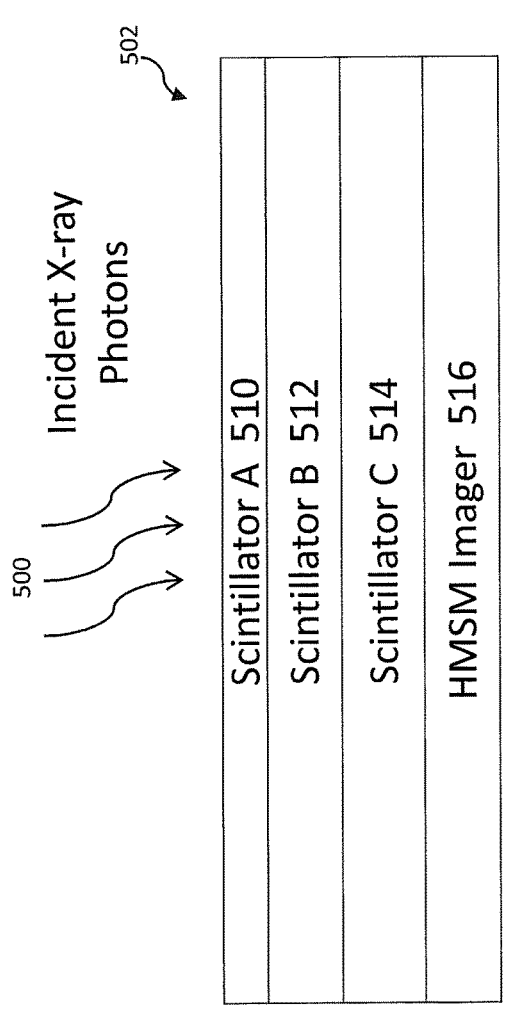
Figure 5D:
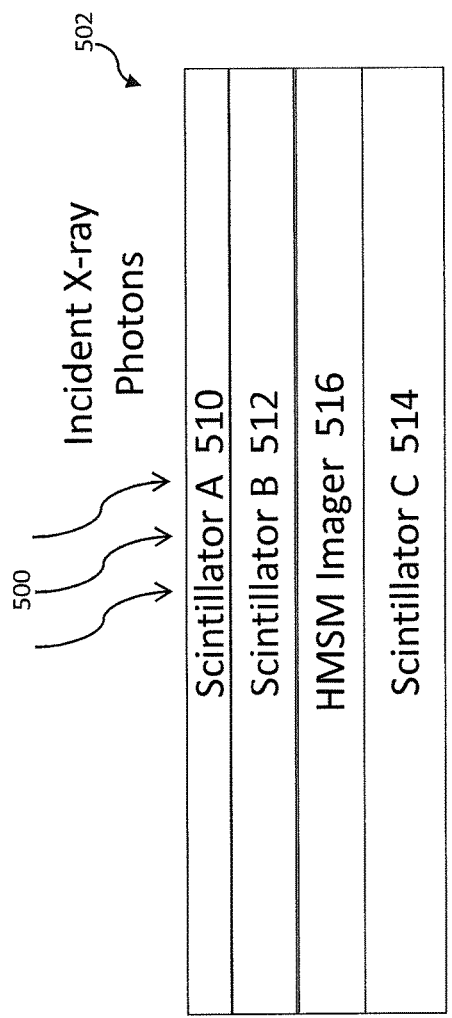

FIG. 5c and FIG. 5d are schematic diagrams of multi-spectral (i.e. triple energy) X-ray imaging systems that utilize the HMSM device shown in FIG. 4h. In the embodiments of FIGS. 5c and 5d, the system 502 includes three different scintillators 510, 512 and 514 that emit light at three different wavelengths (e.g. blue, green and red). The scintillators are placed on top and/or beneath an HMSM imager 516 that can discriminate the light of the three different wavelengths via the properties of the different wavelengths of light absorbed in the semiconductor layers at various depths. Again, in the case of FIG. 5c and FIG. 5d, the three images produced by the three scintillators can be acquired simultaneously implying no motion artifacts. Being able to discriminate between three different X-ray energy spectrums (high, middle and low) can enhance the image quality for X-ray imaging and is akin to X-ray photon counting with three separate energy bins. In the embodiment of FIG. 5d, the thickest scintillator 514 is preferably placed below the HMSM imager 516 to reduce light losses and scattering for scintillator A 510 and scintillator B 512 and also to improve spatial resolution for scintillator C 514 as explained earlier.

Figure 6:
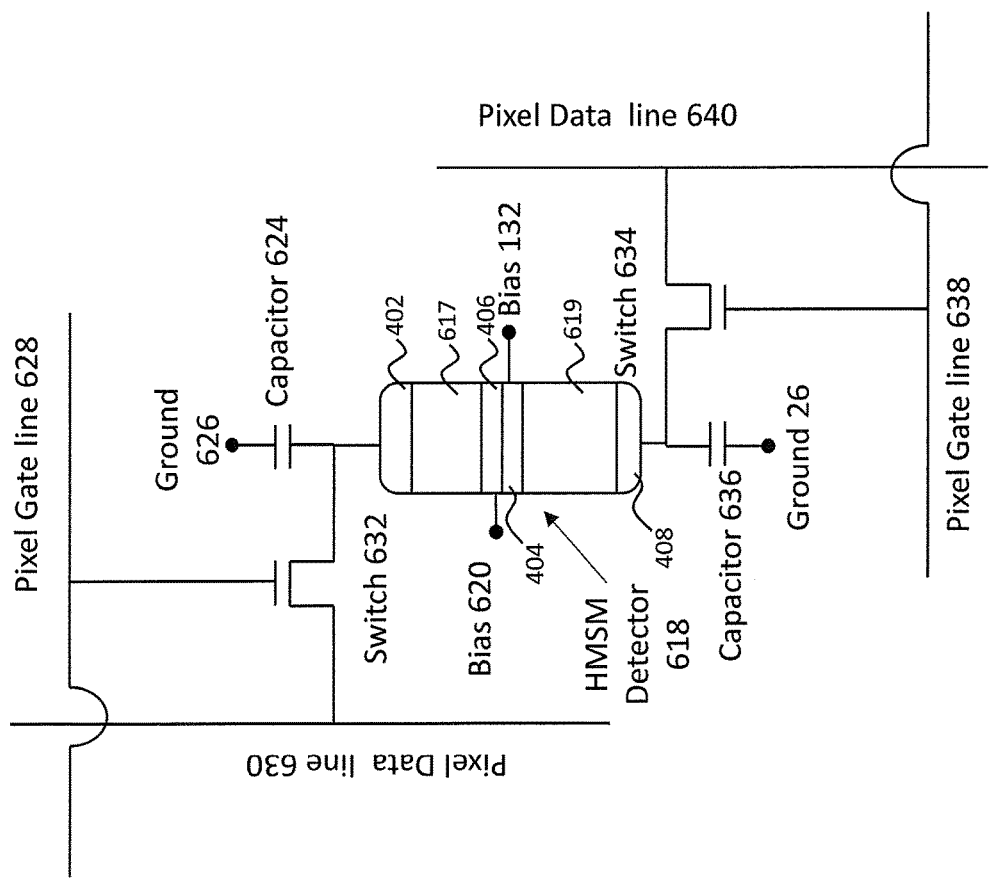
FIG. 6 is a schematic diagram of a pixel level circuit diagram.

FIG. 6 is directed at a pixel level circuit diagram including a HMSM detector 618. In one embodiment, the HMSM detector 618 is the one shown in FIG. 4a which includes a top electrode detector 617 and a bottom electrode detector 619. Alternatively, other the HMSM detector may be any of the ones previously discussed.

In this pixel level circuit diagram, the top HMSM detector 617 preferably has one electrode (bias electrode A 406) connected to a bias 620 and the other electrode (sense electrode A 402) connected to the switch 622 and a storage capacitor 624. The second terminal of the capacitor 624 is connected to ground 626. The TFT switch 622 is driven by the gate line 628 and the top HMSM detector output is transferred to a pixel data line 630 when the switch 622 is ON. Correspondingly, the bottom electrode detector has one electrode (bias electrode B 408) connected to a bias 632 and the other electrode (sense electrode B 404) is connected to the switch 634 and a storage capacitor 636. The second terminal of the capacitor 636 is connected to ground 626. The TFT switch 634 is driven by the gate line 638 and the bottom output is transferred to a pixel data line 640. As understood, the embodiment or implementation shown in FIG. 6 is very general as there is no multiplexing of common signals.

Figure 7B:
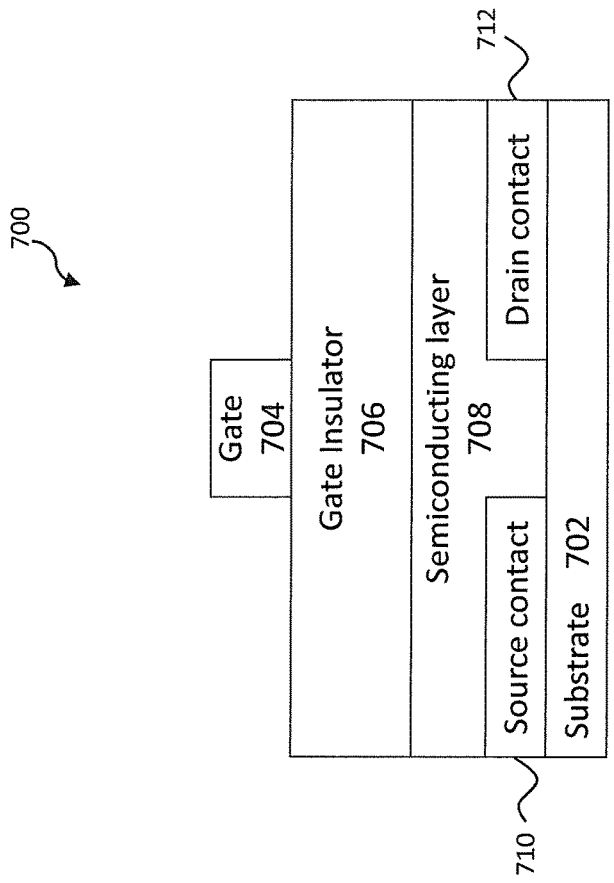
FIGS. 7a and 7b are schematic diagrams of thin-film-transistor (TFT) structures.
Figure 7A:
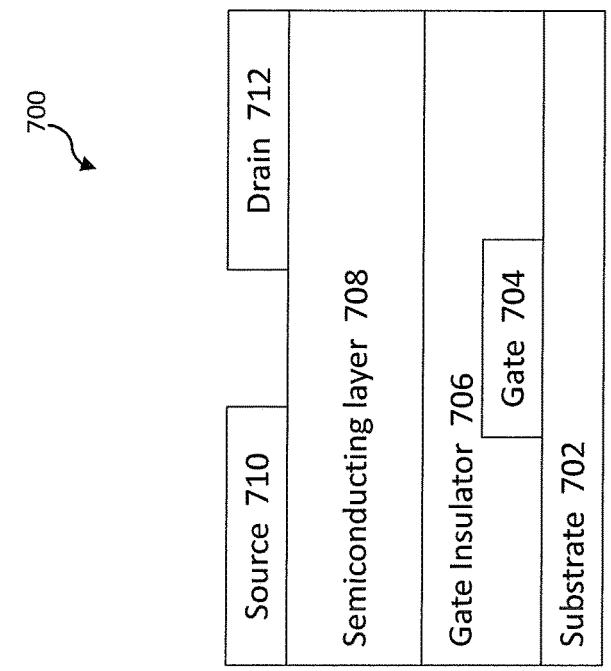

FIG. 7a is a schematic diagram of one embodiment of a TFT structure. The TFT structure 700 may be seen as a bottom gate, inverted staggered TFT structure. The TFT structure 700 includes a substrate 702 (e.g. glass or plastic) having a patterned gate electrode 704, followed by a gate insulator 706, a semiconducting layer 708 and a patterned contact layer defining the source 710 and drain 712 contacts.

FIG. 7b is a schematic diagram of another embodiment of a TFT structure. This embodiment may be seen as a top gate, inverted staggered TFT structure 700 with the layers in a reverse configuration compared to the embodiment of FIG. 7a. Both are implementations of amorphous silicon TFTs in use by the display industry today. Similar cross-sections can be drawn for IGZO, organic, polysilicon and nanowire TFTs and other large area electronics materials as understood by one skilled in the art.

Figure 8:
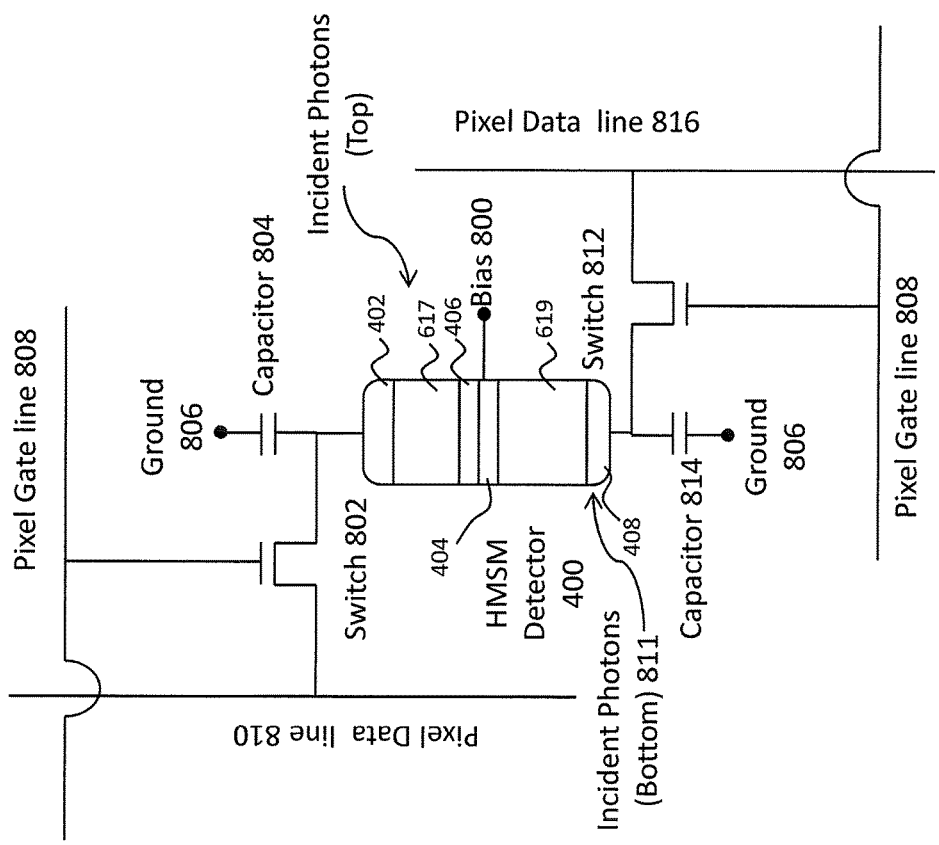
FIG. 8 is another schematic diagram of a pixel level circuit diagram.

FIG. 8 shows a pixel level circuit diagram including a HMSM detector 400, such as the one shown in FIG. 4d. This implementation may be used in system which requires or benefits from the multiplexing of many common signals. Within the HMSM detector 400 is a top electrode MSM detector 410 and a bottom electrode MSM detector 416 such as discussed with respect to FIG. 4d above. The top and bottom electrodes detectors each have one electrode (bias electrodes 406 and 408, respectively) connected to a common bias 800. The other electrode for the top HMSM detector (such as sense electrode A 402) is connected to the switch 802 and a storage capacitor 804. The second terminal of the capacitor 804 is connected to common ground 806. The TFT switch 802 is driven by the gate line 808 and the sense electrode A 402 output is transferred to a pixel data line 810 when the switch 802 is ON. Correspondingly, the bottom sense electrode (such as sense electrode B 404) is connected to the switch 812 and a storage capacitor 814. The second terminal of the capacitor 814 is connected to a common ground 806. The TFT switch 812 is driven by the common gate line 808 to ensure simultaneous data capture while the bottom sense electrode B 404 output is transferred to a discrete pixel data line 816.

Figure 9:
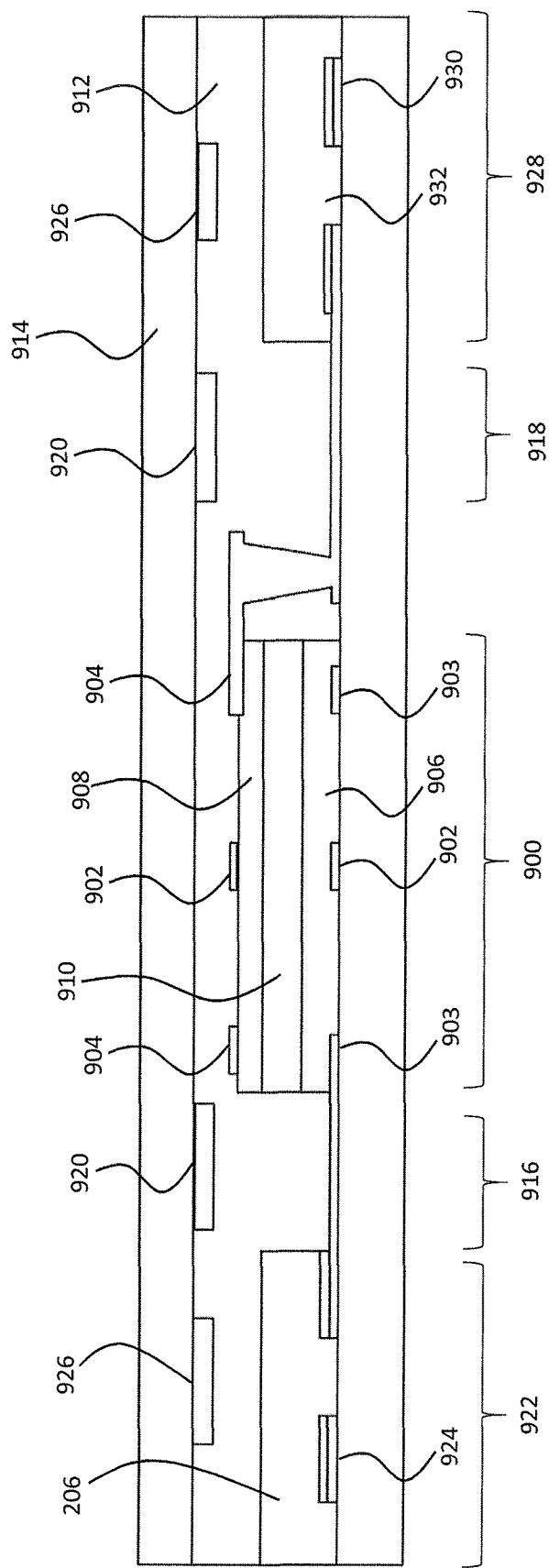
FIG. 9 is a cross-section of a pixel element.

FIG. 9 shows a cross-section of a preferred implementation of a pixel using the HMSM of FIG. 4d, the bottom gate TFT architecture of FIG. 7a and the pixel circuit of FIG. 8.

In FIG. 9, the HMSM detector cross-section structure 900 shows bias electrodes 902, sense A electrodes 903 and sense B electrodes 904, both in a commonly known comb electrode configuration along with blocking layers 906 and 908. In one embodiment, the blocking layers 906 and 908 may be made from one of amorphous silicon nitride, amorphous silicon oxide, amorphous silicon oxynitride, benzocyclobutene (BCB), polyimide or polystyrene), a semiconducting layer of amorphous silicon 910 (or alternately, one or more of molybdenum sulphide, Indium Gallium Zinc Oxide, polycrystalline silicon, amorphous selenium, mercuric iodide, lead oxide, microcrystalline silicon, nanocrystalline silicon, crystalline silicon, silicon nanowires, PTCBI, or CuPc.

The structure 900 further includes an amorphous silicon nitride anti-reflective layer 912 and an amorphous silicon nitride passivation layer 914. Two capacitor cross-sections are shown, one 916 for the bottom (sense A electrode or electrodes 903) and the other 918 for the top sense electrode (sense B electrode of electrodes 904). The capacitor cross-sections shows the bottom plate shared with either the sense A electrode 903 or sense B electrode 904 along with a top capacitor plate connected to ground 920, typically a low electric potential. The capacitor dielectric in this case is within the amorphous silicon nitride layer 912, and is shared with the anti-reflective layer in the HMSM detector cross-section 900.

Furthermore, within the structure, there are two TFTs, one for each sense electrode. The first TFT A cross-section 922 includes sense A electrode 903 functioning as a TFT source/drain electrode with the other TFT source/drain electrode being connected to the pixel data line 924 (i.e. the data line 812 in FIG. 8). Also shown is a gate electrode 926 connected to the pixel gate line such as pixel gate line 808 of FIG. 8. The second TFT B cross-section 928 includes a sense B electrode 904 functioning as a TFT source/drain electrode with the other TFT source/drain electrode being connected to the pixel data line 930 (i.e. the data line 168 in FIG. 8). Also shown is the common gate electrode 926 connected to the pixel gate line 166 in FIG. 8. For TFT cross-sections 922 and 928, an amorphous silicon layer 932 is the active layer and this may or may not be shared with the HMSM detector cross-section 900. In FIG. 9, it is not shared since a thicker semiconducting layer could be necessary for the HMSM structure 900. The TFT gate dielectric is formed by an amorphous silicon nitride layer 912, shared with the anti-reflective layer shown in the HMSM detector's cross-section 900 and also the dielectric layer for both capacitor A 916 and capacitor B 918.

One of the benefits of the co-planar design shown in FIG. 9 is that it allows for shared uses of multiple layers, for example, the TFT gate dielectric can serve as an anti-reflective coating layer. In the HMSM detector, such as detector 400 of FIG. 8, because the conduction path is horizontal, the horizontal interface is primarily important. Using an insulator layer helps protect the interface to the semiconducting layer. Thus, device performance remains stable in the long term even if the HMSM detector 400 is built in a standard TFT manufacturing process.

Since the MSM or HMSM does not necessarily need a p+ doped layer like the PIN photodiode, blue light emitting phosphors can work which can help reduce the required thickness of the amorphous silicon layer 910 thus enabling sharing with the TFT amorphous silicon layer 932. The HMSM detector may use any one of a number of insulating layers between the contact electrodes and the amorphous silicon, i.e. polyimide, polystyrene, amorphous silicon nitride, amorphous silicon oxide or amorphous silicon oxynitride. Similarly, the anti-reflective layer can be a layer of the same set as described above.

Figure 10:
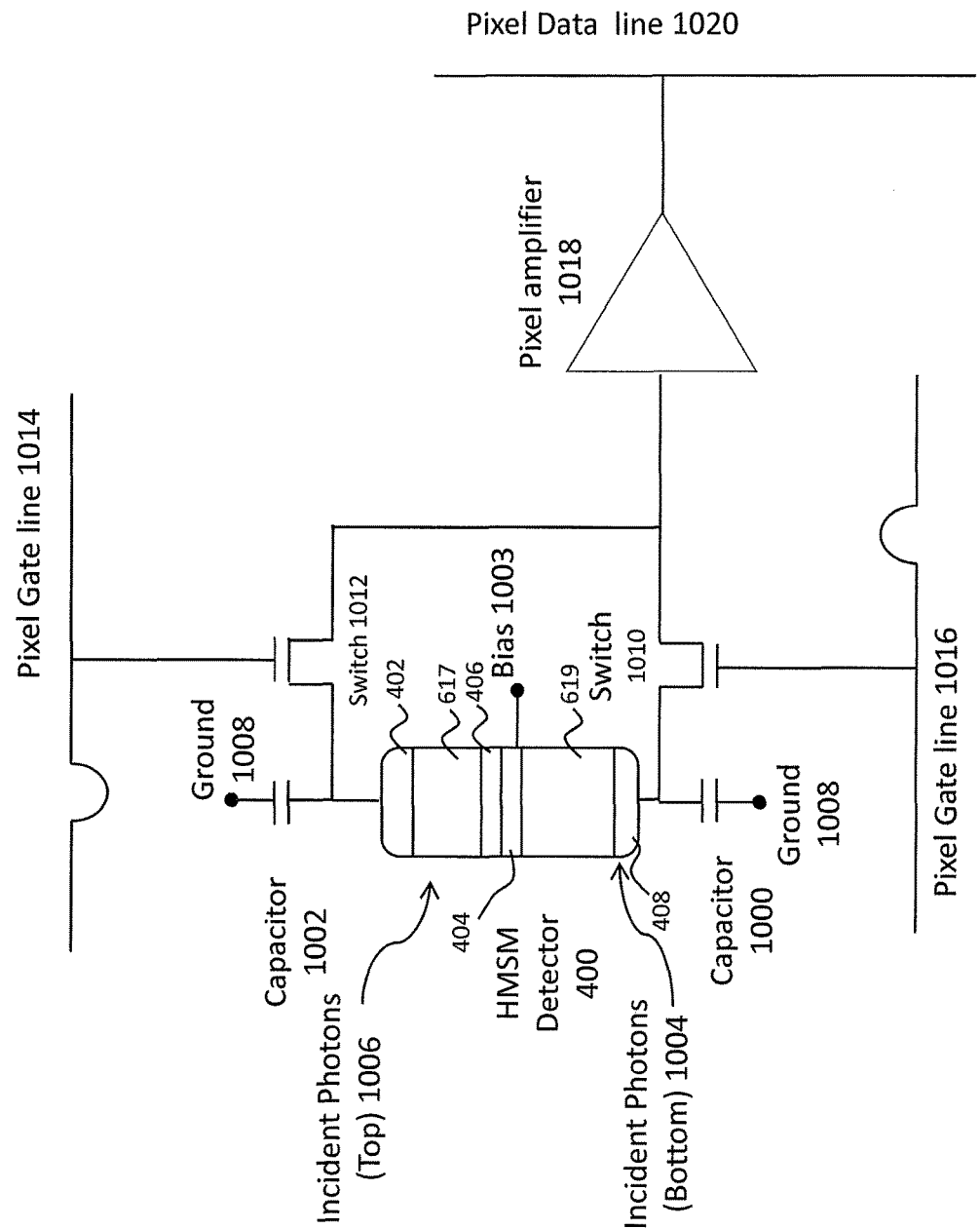
FIG. 10 is a schematic diagram of a further embodiment of a pixel level circuit diagram.

It should be noted that additional implementations of the pixel circuit shown in FIG. 8 are possible that use different readout circuits, such as, for example, an active pixel sensor as shown in FIG. 10. Here, the HMSM detector 400 is connected to two capacitors 1000, 1002 that store the signal created by incident photons on the bottom 1004 and 1006 of the HMSM detector 400. Both capacitors have at least one electrode connected to a common ground 1008 with the other being connected to switches 1010, 1012 that are controlled by discrete pixel gate lines 1014, 1016. The switches transfer the signal to the input of a dual or single stage pixel amplifier 1018, such as disclosed in US Patent Publication No. 20040135911 to Karim et al. (hereby incorporated by reference), which drives a data line 1020. The benefit of this pixel amplifier circuit is the higher signal to noise ratio achievable and the reduction in off-panel readout column amplifiers (as compared to FIG. 8 where two off-panel readout amplifiers are required i.e. one for the top HMSM and one for the bottom HMSM.

In the preceding description, for purposes of explanation, numerous details are set forth in order to provide a thorough understanding of the embodiments. However, it will be apparent to one skilled in the art that these specific details may not be required in order to practice the invention. In some instances, well-known structures may be shown in block diagram form in order not to obscure the invention. For example, specific details are not provided as to whether the embodiments of the invention described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

Various embodiments are described herein. Variations of those embodiments may become apparent to those of ordinary skill in the art upon reading the foregoing description. It is expected that skilled persons will employ such variations as appropriate, and it is expected that the disclosure may be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

Further variations may be apparent or become apparent to those knowledgeable in the field, and are within the scope as defined by the claims.

What is claimed is:

1. A detector element for a digital imaging system, the detector element comprising:
   at least one top electrode metal-semiconductor-metal (MSM) detector; and
   at least one bottom electrode MSM detector;
   wherein said at least one top electrode MSM detector and said at least one bottom electrode MSM detector share a common semiconducting layer.

2. The detector element of claim 1 wherein said top electrode MSM detector comprises:
   the semiconducting layer; and
   a top electrode MSM detector set of electrodes patterned on a top electrode side of the semiconducting layer.

3. The detector element of claim 2 wherein the top electrode MSM detector further comprises:
   a blocking layer deposited between the semiconducting layer and the top electrode MSM detector set of electrodes.

4. The detector element of claim 3 wherein the top electrode MSM detector set of electrodes are spaced laterally apart.

5. The detector element of claim 2 wherein the bottom electrode MSM detector comprises:
   the semiconducting layer; and
   a bottom electrode MSM detector set of electrodes patterned on a bottom side of the semiconducting layer; the bottom side of the semiconducting layer opposite the top side of the semiconducting layer.

6. The detector element of claim 5 wherein the bottom electrode MSM detector further comprises:
   a blocking layer deposited between the bottom electrode MSM detector set of electrodes and the semiconducting layer.

7. The detector element of claim 5 wherein the top electrode MSM detector set of electrodes and the bottom electrode MSM detector set of electrodes share common electrodes.

8. The detector element of claim 1 further comprising a set of scintillators adjacent to at least one of the top or bottom electrode MSM detectors.

9. The detector element of claim 8 wherein the scintillators within the set of scintillators are placed on a top and a bottom side of at least one of the top or bottom electrode MSM detectors.

10. The detector element of claim 9 further comprising a fiber optic faceplate located between two scintillators within the set of scintillators.

* * * * *